US006400932B1

(12) United States Patent
Oh et al.

(10) Patent No.: US 6,400,932 B1
(45) Date of Patent: Jun. 4, 2002

(54) LOW OFFSET AUTOMATIC FREQUENCY TUNING CIRCUITS FOR CONTINUOUS-TIME FILTER

(75) Inventors: Chang Jun Oh; Jong Kee Kwon; Jong Ryul Lee; Won Chul Song; Hee Bum Jung; Kyung Soo Kim; Han Jin Cho, all of Taejon; Ook Kim, Seoul, all of (KR)

(73) Assignee: Electronics and Telecommunications Research Institute, Taejon (KR)

( * ) Notice: Subject to any disclaimer, the term of this patent is extended or adjusted under 35 U.S.C. 154(b) by 0 days.

(21) Appl. No.: 09/454,389

(22) Filed: Dec. 3, 1999

(30) Foreign Application Priority Data

Dec. 3, 1998 (KR) ............................................. 98-52969

(51) Int. Cl.$^7$ ................................................ H04B 1/18
(52) U.S. Cl. ..................................... 455/150.1; 455/340
(58) Field of Search .............................. 455/150.1, 254, 455/271, 281, 286, 289, 33, 331, 340; 333/165, 166, 167, 168, 169, 170, 171, 172, 173, 174, 175, 176–212; 334/52, 55, 84

(56) References Cited

U.S. PATENT DOCUMENTS

| 4,748,683 A | * | 5/1988 | Sato ............................ 455/164 |
| 4,818,903 A | | 4/1989 | Kawano ...................... 307/521 |
| 4,851,719 A | | 7/1989 | Hitomi ........................ 307/521 |

(List continued on next page.)

OTHER PUBLICATIONS

Krummenacher and Joehl, "A 4–MHz CMOS Continuous–Time Filter with On–Chip Automatic Tuning," *IEEE Journal of Solid–State Circuits*, 23(3):750–758, 1988.

Khoury, "Design of a 15–MHz CMOS Continuous–Time Filter with On–Chip Tuning," *IEEE Journal of Solid–State Circuits*, 26(12):1988–1997, 1991.

Nauta, "A CMOS Transconductance–C Filter Technique for Very High Frequencies," *IEEE Journal of Solid–State Circuits*, 27(2):142–153, 1992.

(List continued on next page.)

Primary Examiner—Nguyen T. Vo
Assistant Examiner—N. Mehrpour
(74) Attorney, Agent, or Firm—SEED IP Law Group, PLLC

(57) ABSTRACT

The present invention relates to a tuning circuit, more specifically to a tuning circuit for continuous-time filter capable of making exact the Gm value to minimize the variation of the cutoff frequency due to the variation of process in the Gm-C type of continuous-time filter. According to the invention, a frequency tuning circuit is provided which comprises integrating means for generating a signal discharging from a first reference voltage to a first predetermined value and a signal charging from a second reference voltage to a second predetermined value; offset sampling means for sampling the offset voltages of the Gm cells by receiving a current multiplied by the offset voltages from the Gm cells included in the integrating means and providing a feedback path between the output nodes and the input nodes of the included Gm cells; comparative signal generating means for generating a comparative signal by generating a reference signal by dividing a clock inputted from the external, receiving the signal discharging from the first reference voltage to the first predetermined value and the signal charging from the second reference voltage to the second predetermined value from the integrating means, and comparing the actual intersection and the target intersection of these signals; and control means for generating a control signal to regulate the Gm values of the integrating means and the offset sampling means by receiving the reference signal and the comparative signal from the comparative signal generating means and detecting the phase differences therebetween.

5 Claims, 2 Drawing Sheets

U.S. PATENT DOCUMENTS

| | | | | |
|---|---|---|---|---|
| 5,243,431 A | * | 9/1993 | Inagaki | 358/198 |
| 5,281,931 A | | 1/1994 | Bailey et al. | 333/17.1 |
| 5,625,317 A | | 4/1997 | Deveirman | 327/353 |
| 5,650,950 A | | 7/1997 | Siniscalchi et al. | 364/607 |
| 5,684,431 A | * | 11/1997 | Gilbert et al. | 330/254 |
| 6,249,189 B1 | * | 6/2001 | Wu et al. | 331/18 |

OTHER PUBLICATIONS

Stefanelli and Kaiser, A 2µm CMOS Fifth–Order Low–Pass Continuous–Time Filter for Video–Frequency Applications, *IEEE Journal of Solid–State Circuits,* 28(7):713–718, 1993.

Chang et al., "A Highly Linear CMOS Gm–C Bandpass Filter for Video Applications," *IEEE 1996 Custom Integrated Circuits Conference,* pp. 89–92, 1996.

* cited by examiner

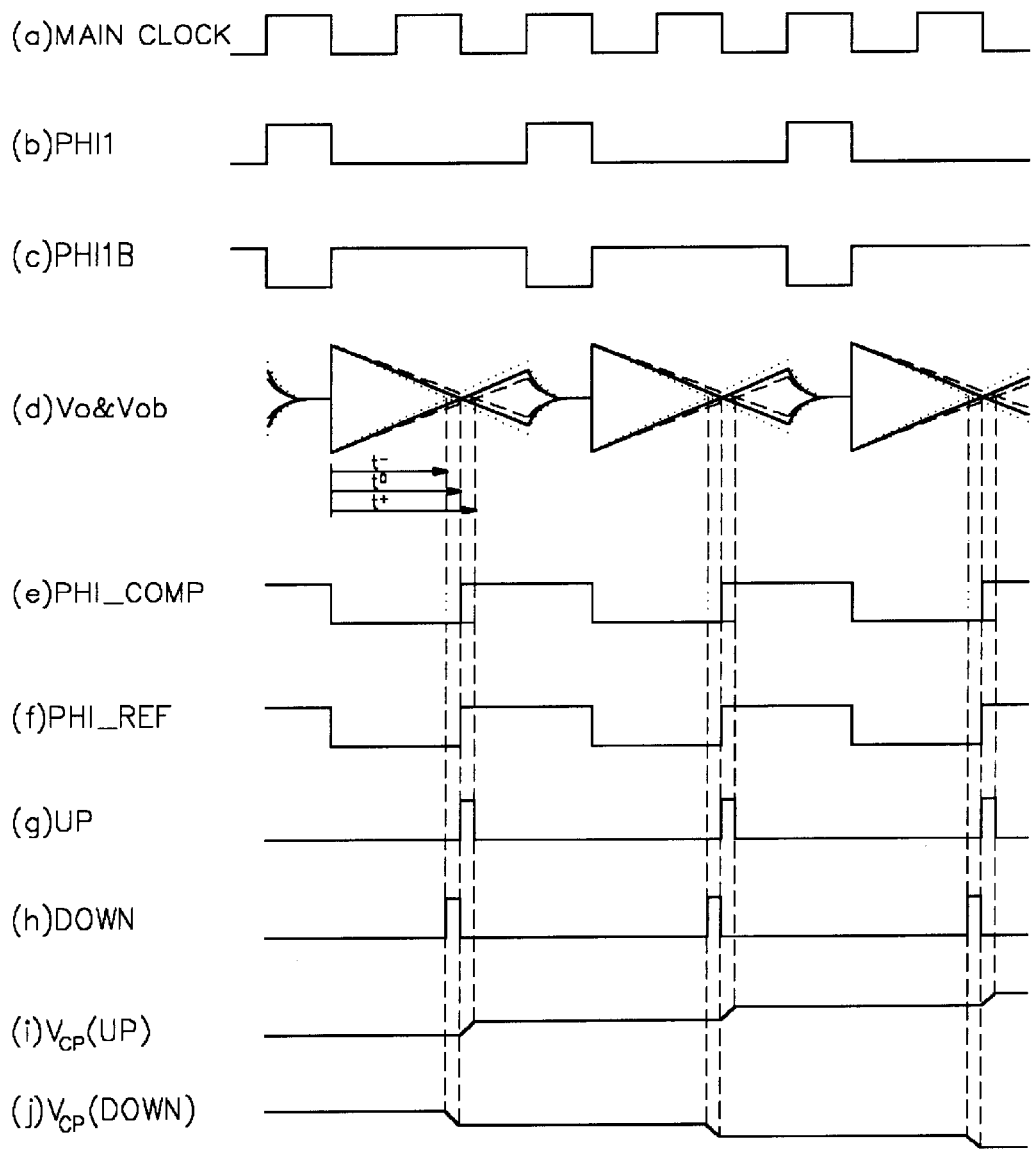

a
LOW OFFSET AUTOMATIC FREQUENCY TUNING CIRCUITS FOR CONTINUOUS-TIME FILTER

TECHNICAL FIELD

The present invention relates to a tuning circuit, more specifically to a frequency tuning circuit for continuous-time filter capable of making exact Gm value to minimize the variation of the cutoff frequency due to the variation of process in Gm-C type of continuous-time filter.

BACKGROUND OF THE INVENTION

Generally, because CMOS suffers from severe variation of process as compared to bipolar, in the circuit such as the Gm-C type of continuous-time filter, the drift of the Gm value is induced, causing the cutoff frequency of the filter to drift. Therefore, the Gm tuning in the CMOS Gm-type continuous-time filter is essential.

In the prior art, the circuit is disclosed which performs the tuning by using the filter circuit composed of a oscillator oscillating at the cutoff frequency in tuning mode without using the tuning circuits.

However, although the above-mentioned prior art circuit has the advantages of obtaining an exact tuning value due to the direct use of the filter circuit in tuning without additional tuning circuits, it has problems that trimming resistors or programmable current sources are necessary in order to regulate the bias current, and the filter circuit cannot be employed when the information signal is inputted continuously into the filter circuit with no null state.

Also, the tuning method using the ratio of the amplitudes before and after passing through the filter to the given reference signal is also disclosed in the prior art.

However, the prior art has the problems that only one tuning can be performed under the ON of the power supply of the system if the signal inputted to the system is continuous, and the tuning can be performed only if a signal is in the temporary cutoff, namely null state.

Further, the tuning method is disclosed which a oscillator consists of the same cell as a main filter circuit, and comprises the steps comparing the frequencies and phases of the oscillator and those of a reference signal and making the differences therebetween minimize.

However, the prior art has the problems that cutoff frequency is drifted since the offset generated by the band-pass filter used in the tuning circuit cannot be corrected.

SUMMARY OF THE INVENTION

The present invention is for avoiding the above-mentioned problems, and has the object to provide a tuning circuit for continuous-time filter having a target Gm value without being affected by the variation of process by correcting the offset generated in Gm cell of the tuning circuit, and having reduced consumption of electric power and clock feedthrough by intermittently operating the tuning circuit regardless of the operation of the main filter circuit.

In order to accomplish the object, in accordance with the invention, a tuning circuit is provided which comprises:

Integenerating a current multiplied by a voltage difference of the first reference voltage and the second reference voltage, generating a signal discharging from the first reference voltage to a first predetermined value and a signal charging from the second reference voltage to a second predetermined value according to the generated current, and tuning the Gm cells according to a control signal inputted to a control terminal;

Offset sampling means for receiving the current multiplied by the offset voltages from the Gm cells of the integrating means, sampling the offset voltages of the Gm cells by providing a feedback path between output nodes and input nodes of the Gm cells and generating a current multiplied by the sampled offset voltage, and tuning the Gm cells according to the control signal inputted to the control terminal;

Comparative signal generating means for generating a reference signal by dividing a clock inputted from the external, receiving the signal discharging from the first reference voltage to the first predetermined value and the signal charging from the second reference voltage to the second predetermined value from the integrating means, and generating a comparative signal to compare an actual intersection and a target intersection of these signals; and Control means for generating a control signal to regulate Gm values of the integrating means and the offset sampling means by receiving the reference signal and the comparative signal from the comparative signal generating means and detecting phase differences therebetween

BRIEF DESCRIPTION OF THE DRAWINGS

FIG. 2 is a waveform diagram to illustrate the operation of FIG. 1.

DETAILED DESCRIPTION OF THE INVENTION

Figure 1:
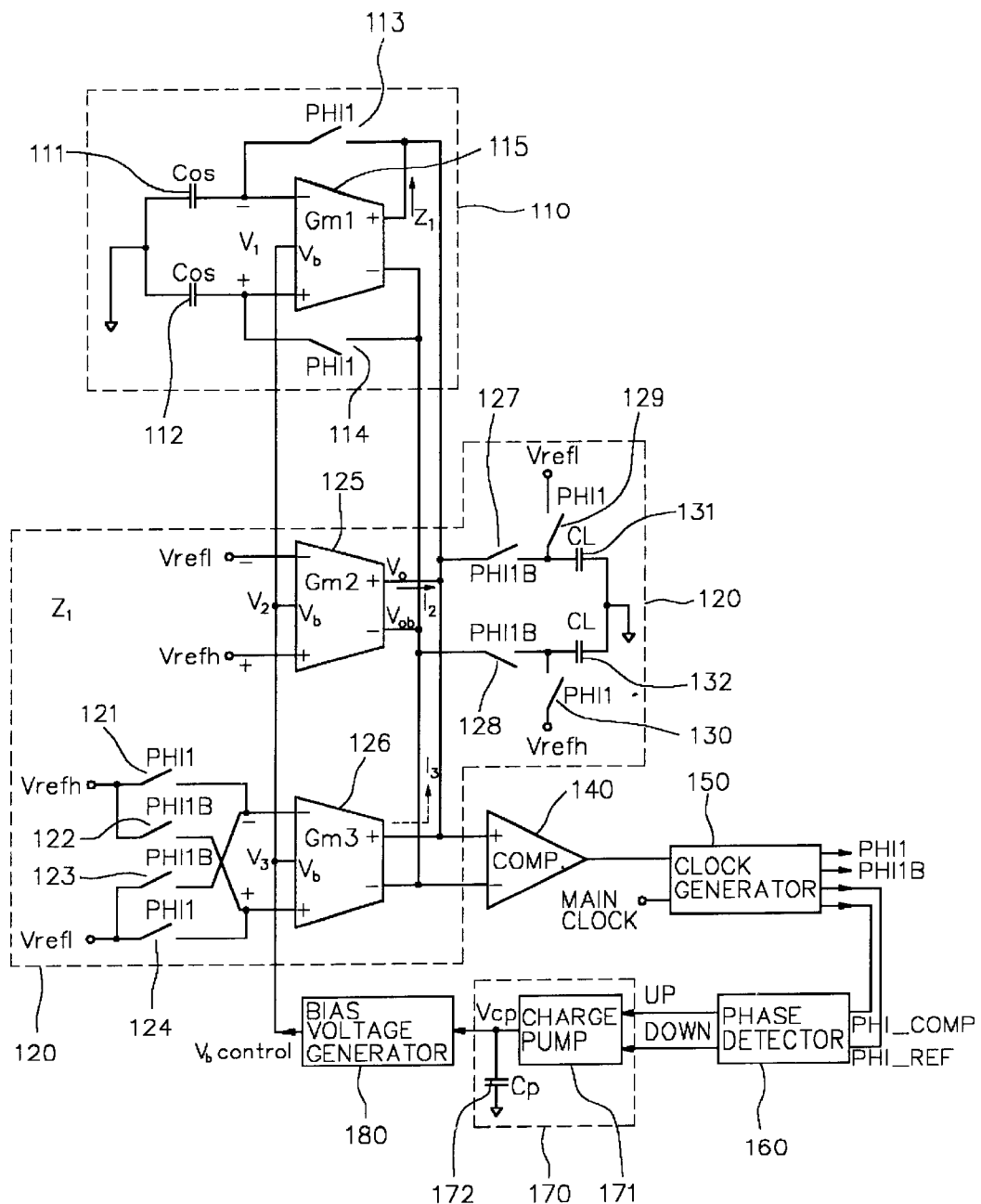
FIG. 1 is a circuit diagram of a frequency tuning circuit for continuous-time filter according to an embodiment of the present invention.

The present invention will be more clearly understood through the preferable embodiments referring to the attached drawings.

FIG. 1 is a circuit diagram of a frequency tuning circuit for continuous-time filter according to an embodiment of the present invention.

As shown in FIG. 1, the frequency tuning circuit for continuous-time filter according to an embodiment of the present invention comprises a offset sampler 110, a integrator 120, a comparator 140, a clock generator 150, a phase detector 160, a charger 170 and a bias voltage generator 180.

The offset sampler 110 comprises a first and a second switches 113, 114 which are ON when the output voltage PHI1 of the clock generator 150 is high; a first Gm cell 115; a first capacitor 111 of which one terminal is grounded and the other terminal is connected to the negative input terminal of the first Gm cell 115 and to the first switch 113; and the second capacitor 112 of which one terminal is grounded and the other terminal is connected to the positive input terminal of the first Gm cell 115 and to the second switch 114; the first Gm cell 115 including the negative input terminal being connected to the first capacitor 111 and to the first switch 113, the positive terminal being connected to the second capacitor 112 and to the second switch 114, the positive output terminal being connected to the first switch 113, the negative output terminal being connected to the second switch 114, and a control terminal.

The first and the second capacitors 111, 112 in the offset sampler 110 are charged when the first and the second switches 113, 114 are closed (PHI1 is high), and maintain the charged state when the first and the second switches 113, 114 are opened (PHI1 is low), which makes the voltages across the first and the second capacitors 111, 112 have the sampled offset voltage values.

Further, the integrator 120 comprises a second Gm cell 125 which includes a control terminal, the negative input terminal being connected to a first reference voltage $V_{refl}$, the positive input terminal being connected to a second reference voltage $V_{refh}$, the positive output terminal being connected to the positive output terminal of the first Gm cell 115, and the negative output terminal being connected to the negative output terminal of the first Gm cell 115; a third switch 127 which is connected to the positive output terminal of the first and the second Gm cells 115, 125, and is ON when the output voltage PHI1B of the clock generator 150 is high; a fourth switch 128 which is connected to the negative output terminal of the first and the second Gm cells 115, 125 and is ON when the output voltage PHI1B of the clock generator 150 is high; a fifth switch 129 of which one terminal is connected to the first reference voltage and which is ON when the output voltage PHI1 of the clock generator 150 is high; a sixth switch 130 of which one terminal is connected to the second reference voltage and which is ON when the output voltage PHI1 of the clock generator 150 is high; a third capacitor 131 of which one terminal is grounded and the other terminal is connected to the third and the fifth switches 127, 129; a fourth capacitor 132 of which one terminal is grounded and the other terminal is connected to the fourth and the sixth switches 128, 130; a seventh switch 121 of which one terminal is connected to the second reference voltage and which is ON when the output voltage PHI1 of the clock generator 150 is high; a eighth switch 122 of which one terminal is connected to the second reference voltage and which is ON when the output voltage PHI1B of the clock generator 150 is high; a ninth switch 123 of which one terminal is connected to the first reference voltage, and which is ON when the output voltage PHI1B of the clock generator 150 is high; a tenth switch 124 of which one terminal is connected to the first reference voltage and which is ON when the output voltage PHI1 of the clock generator 150 is high; and a third Gm cell 126 of which the negative input terminal is connected to the seventh and the ninth switches 121, 123, the positive input terminal is connected to the eighth and the tenth switches 122, 124, the positive output terminal is connected to the positive output terminal of the first and the second Gm cells 115, 125, and the negative output terminal is connected to the negative output terminal of the first and the second Gm cells 115, 125.

The second Gm cell 125 of the integrator 120 performs the integrating operation by charging the third and the fourth capacitors 131, 132 through the third and the fourth switches 127, 128 according to the reference voltages $V_{refh}$, $V_{refl}$ which are applied to the input terminal when the clock signal PHI1B is high.

Also, the third and the fourth capacitors 131, 132 of the integrator 120 are connected to the first reference voltage $V_{refl}$ and the second reference voltage $V_{refh}$ through the fifth and the sixth switches 129, 130 controlled by the clock PHI1 for initializing the voltages of the third and the fourth capacitors 131, 132.

Further, in the integrator 120, the third Gm cell 126 is additionally employed to apply a signal which has the same magnitude and opposite polarity of the signal applied to the input of the second Gm cell 125 to the third Gm cell 126 and offset the components by these signals, in order to sample only the offset components when the offset voltages are sampled in the offset sampler 110 during PHI1 is high.

With the first, the second and the third Gm cells 115, 125, 126 in the present invention being the same cell, the total current (Itotal) flowing in the output nodes Vo, Vob when PHI1 is high is represented by the following formula 1.

$$Itotal = I1 + I2 + I3 \quad \text{[Formula 1]}$$
$$= Gm(V1 + Vos1) + Gm(V2 + Vos2) +$$
$$Gm(V3 + Vos3)$$

where, Vos1, Vos2 and Vos3 represent the offset voltages applied to the first, the second and the third Gm cells 115, 125, 126, respectively.

Also, the formula 1 is converted to the following formula 2 since $V2=Vr(=V_{refh}-V_{refl})$, $V3=-Vr(=V_{refl}-V_{refh})$ when PHI1 is high, and the total current (Itotal) flowing in the output nodes Vo, Vob is feedbacked to be 0.

$$Gm(V1+Vos1+Vr+Vos2+(-Vr)+Vos3)=0 \quad \text{[Formula 2]}$$
$$V1=-(Vos1+Vos2+Vos3)$$

Therefore, as shown in the formula 2, only offset voltages of three Gm cells 115, 125, 126 are sampled across the input terminal of the first Gm cell 115, namely, the first and the second capacitors 111, 112.

When the clock signal PHI1B is high, all switches 127, 128, 122, 123 such as the third and the fourth switches 127, 128 controlled by clock PHI1B signal are closed, and all switches 113, 114, 129, 130, 121, 124 controlled by clock PHI1 are open, which makes the integrator 120 operate. At this time, the integrated current is represented by the following formula 3 wherein $V1=V2=Vr(=V_{refh}-V_{refl})$.

$$Itotal = I1 + I2 + I3 \quad \text{[Formula 3]}$$
$$= Gm(V1 + Vos1) + Gm(V2 + Vos2) +$$
$$Gm(V3 + Vos3)$$
$$= Gm(V1 + Vos1 + Vos2 + Vos3 + Vr + Vr)$$
$$= Gm(2Vr)$$

With V1 in the formula 3 being −(Vos1+Vos2+Vos3) when PHI1 is high as shown in the formula 2, the components Vos1, Vos2, and Vos3 of all Gm cells 115, 125, and 126 are offset in the total integrated currents of the formula 3, thereby to remain the net signal component of 2 GmVr.

The third capacitor 131 is charged with the integrated current of the formula 3 to rise the voltage of the positive output node Vo of the integrator 120. At this time, because of the circuit of the present invention being the differential structure, the fourth capacitor 132 is discharged as much as the charge amount of the third capacitor 131 to drop the voltage of the negative output node Vob of the integrator 120.

The Comparator 140 discriminates the intersection of the magnitudes of the output voltages Vo and Vob of the integrator 120 and outputs the results, and the clock generator 150 generates a signal(PHI_COMP/PHI_REF) for comparing the actual intersection and the target intersection using the output of the comparator 140 and the main clock signal.

The PHI_COMP is a signal generated using the output of the comparator, and PHI_REF is generated as a reference signal to be tuned by dividing the main clock signal.

Further, the clock generator 150 generates and provides PHI1, PHI1B clock signals which are employed in the present tuning circuit. The phase detector 160 generates UP/DOWN signals by detecting phase difference of the PHI_COMP and PHI_REF clock signals generated in the clock generator 150. If the phase of the PHI_COMP clock signal advances that of the PHI_REF clock signal, DOWN pulse decreasing Gm value is generated since the actual intersection precedes the target intersection due to the increased Gm value. If the phase of the PHI_REF clock signal advances to that of the PHI-COMP clock signal, UP pulse increasing Gm value is generated since the actual intersection lags the target intersection due to the decreased Gm value.

By using the UP/DOWN signal, charge pump 171 of the charger 170 causes the charging/discharging in the fifth capacitor 172 connected to the output terminal, resulting in the generated $V_{cp}$ voltage based on the charging/discharging being stored in the fifth capacitor 172.

The bias voltage generator 180 generates the Vb control voltage based on the variation of $V_{cp}$ to regulate Gm values of each Gm cell 115, 125, 126. Such a feedback loop is repeated until the desired Gm value is obtained.

FIG. 2 is a waveform diagram to illustrate the operation of FIG. 1.

In FIG. 2, (a) represents the main clock signal inputted from the external, (b) and (c) represent the PHI1 and PHI1B clock signals generated in the clock generator, (d) represents the output signals Vo and Vob of the integrator, (e) and (f) represent the PHI_COMP and PHI_REF signals outputted from the clock generator, (g) and (h) represent the UP and DOWN signals outputted from the phase detector, and (i) and (j) represent the charging voltages $V_{cp}$(UP) and $V_{cp}$(DOWN) of the capacitor of the charger.

Now, each waveform is explained in detail.

First, (a) is the main clock signals inputted from the external, and (b) and (c) are the clock signals generated in the clock generator using the main clock signal (a) and used in the internal of the tuning circuit. Waveform (d) indicates the voltage variation of the output nodes Vo and Vob of the integrator, wherein t0 indicates the intersection of the both outputs is set to the target Gm value, t– indicates the intersection becomes early with the Gm value being greater than the target value, and t+ indicates the intersection becomes late with the Gm value being smaller than the target value. (e) indicates a signal generated in the clock generator according to the three cases of (d), this signal indicating the intersection of the voltage magnitudes of the both output nodes of the integrator.

The phase detector receives the signal (e) and the reference signal (f) generated by 2-dividing the main clock signal (a) and detects the phase difference therebetween. If the phase of the signal (e) advances to that of the reference signal (f), the DOWN pulse such as the signal (h) is generated to reduce the Gm value since the integrated current flows more than the reference value with the Gm value being larger than the target value. Conversely, if the phase of the signal (f) advances to that of the signal (e), the UP pulse such as the signal (g) is generated to increase the Gm value since the integrated current flows less than the reference value with the Gm value being smaller than the target value. At this time, the widths of the pulses are equivalent to the magnitude of the phase difference.

The charge pump of the charger causes to charge/discharge in the capacitor during the period corresponding to the pulse widths according to the UP/DOWN pulses (g) and (h), generates the $V_{cp}$ voltage corresponding to the tuning voltage, as shown in the signals (i) and (j) and provides the $V_{cp}$ voltage to the bias voltage generator, thereby to regulate the Gm value.

The tuning voltage is stored in the capacitor, and once the tuning voltage is converged on the target Gm value, thereafter every cycle the tuning voltage is restored by the amount reduced due to the leakage.

However, the amount of the leakage is very small, and therefore the present tuning circuit may be operated intermittently, not continuously. Hence, the present tuning circuit has advantages that the consumption of electric power and feedthrough by the clock signal are substantially reduced.

The present invention has the following effects:

Firstly, the tuning circuit for continuous-time filter according to the invention can minimize the variation of the cutoff frequency of the filter by correcting the offset of Gm cells used in the tuning circuit.

Secondly, the present tuning circuit is not necessary to be continuously operated since the converged tuning voltage is stored in the capacitor connected to the output of the charge pump, may be intermittently operated only if the tuning voltage is restored by the amount reduced by the leakage, and may be operated once for a few seconds with the amount of the leakage being very small.

Thirdly, the present tuning circuit may be intermittently operated, resulting in the consumption of electric power and feedthrough by the clock signal being substantially reduced.

Although the preferred embodiments of the present invention have been disclosed with the drawings for illustrative purposes, those skilled in the art will appreciate that various modifications, additions and substitutions are possible, without departing from the scope and spirit of the invention as disclosed in the accompanying claims.

What is claimed is:

1. A frequency tuning circuit which comprises:

integrating means for receiving a current multiplied by an offset voltage of each of Gm cells, receiving a first reference voltage and a second reference voltage from an external, generating a current multiplied by a voltage difference of the first reference voltage and the second reference voltage, generating a signal discharging from the first reference voltage to a first predetermined value and a signal charging from the second reference voltage to a second predetermined value according to the generated current, and tuning the Gm cells according to a control signal inputted to a control terminal;

offset sampling means for receiving the current multiplied by the offset voltages from the Gm cells of the integrating means, sampling the offset voltages of the Gm cells by providing a feedback path between output nodes and input nodes of the Gm cells and generating a current multiplied by the sampled offset voltage, and tuning the Gm cells according to the control signal inputted to the control terminal;

comparative signal generating means for generating a reference signal by dividing a clock inputted from the external, receiving the signal discharging from the first reference voltage to the first predetermined value and the signal charging from the second reference voltage to the second predetermined value from the integrating means, and generating a comparative signal to compare an actual intersection and a target intersection of these signals; and control means for generating a control signal to regulate Gm values of the integrating means and the offset sampling means by receiving the reference signal and the comparative signal from the comparative signal generating means and detecting phase differences therebetween.

2. The frequency tuning circuit according to the claim 1, wherein the offset sampling means comprises:
- a first switch which is controlled by a first output signal of said comparative signal generating means;
- a second switch which is controlled by the first output signal of said comparative signal generating means;
- a first capacitor of which one terminal is grounded and the other terminal is connected to said first switch;
- a second capacitor of which one terminal is grounded and the other terminal is connected to said second switch; and
- a first Gm cell having a negative input terminal being connected to said first capacitor and said first switch, a positive input terminal being connected to said second capacitor and said second switch, a positive output terminal being connected to said first switch, a negative output terminal being connected to said second switch, and a control terminal,
- wherein said first and second capacitors are charged when said first and second switches are ON, and maintain the charged state when said first and second switches are OFF, thereby to make a voltage across said first and second capacitors have a sampled offset voltage value.

3. The frequency tuning circuit according to the claim 2, wherein said integrating means comprises:
- a second Gm cell having an output terminal being connected to said offset sampling means and a control terminal, the second Gm cell receiving the first reference voltage and the second reference voltage from the external and outputting a signal multiplied by the difference signal of the first and the second reference voltages and the offset voltage;
- a third Gm cell having a control terminal, the third Gm cell receiving the first and the second reference voltages from the external, being controlled by the first output signal of said comparative signal generating means, outputting the opposite polarity signal to offset a signal multiplied by the difference signal of said second Gm cell, being controlled by the second output signal of said comparative signal generating means, and outputting a signal multiplied by the difference signal of the first and the second reference voltages and the offset voltage;
- a couple of capacitors of differential structure, the capacitors receiving the first and the second reference voltages from the external, being controlled and charged/discharged by the first output signal of said comparative signal generating means, and being controlled by the second output signal of said comparative signal generating means and charged/discharged based the output signal from said second Gm cell,
- wherein the voltage across said capacitors generates the signal discharged from the first reference voltage to the first predetermined value and the signal charged from the second reference voltage to the second predetermined value, and outputs the signals to said comparative signal generating means.

4. The frequency tuning circuit according to the claim 3, wherein said comparative signal generating means comprises:
- a comparator for discriminating the intersection of the magnitudes of the output voltages of the integrating means and outputting the results; and
- a clock generator receiving the results of said comparator for generating and outputting the reference signal generated by dividing the main clock signal inputted from the external and a signal for comparing the actual intersection and the target intersection for the magnitudes of the output voltages, and for generating and outputting a first output signal and a second output signal.

5. The frequency tuning circuit according to the claim 4, wherein said control means comprises:
- a phase detector for generating DOWN pulse decreasing Gm value if the phase of the comparative signal advances that of the reference signal and UP pulse increasing Gm value if the phase of the reference signal advances that of the comparative signal, and for outputting the DOWN pulse and UP pulse;
- charging means for maintaining the charged state if the UP pulse is charged to a first value after receiving the UP pulse from said phase detector, and for maintaining the discharged state if the DOWN pulse is discharged to a second value after receiving the Down pulse from said phase detector; and
- a bias voltage generator for generating a control signal to tune the Gm values of each of said Gm cells according to the output of said charging means.

* * * * *